US009905555B2

(12) United States Patent
Naito et al.

(10) Patent No.: US 9,905,555 B2
(45) Date of Patent: Feb. 27, 2018

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventors: Tatsuya Naito, Matsumoto (JP); Masahito Otsuki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/335,440

(22) Filed: Oct. 27, 2016

(65) Prior Publication Data

US 2017/0047319 A1 Feb. 16, 2017

Related U.S. Application Data

(63) Continuation of application No. PCT/JP2015/077376, filed on Sep. 28, 2015.

(30) Foreign Application Priority Data

Oct. 24, 2014 (JP) .................................. 2014-216872

(51) Int. Cl.
*H01L 29/66* (2006.01)
*H01L 27/06* (2006.01)
(Continued)

(52) U.S. Cl.
CPC ........ *H01L 27/0623* (2013.01); *H01L 21/265* (2013.01); *H01L 21/304* (2013.01);
(Continued)

(58) Field of Classification Search
CPC ............. H01L 27/0623; H01L 29/7395; H01L 21/304; H01L 29/0619; H01L 29/0634;
(Continued)

(56) References Cited

U.S. PATENT DOCUMENTS 8,258,032 B2 * 9/2012 Yoshikawa ......... H01L 29/0634
257/341
2006/0216896 A1 9/2006 Saito et al.
(Continued)

FOREIGN PATENT DOCUMENTS

JP 2006269720 A 10/2006
JP 2006-344779 A 12/2006
(Continued)

OTHER PUBLICATIONS

International Search Report for International Application No. PCT/JP2015/077376 issued by the Japan Patent Office dated Nov. 24, 2015.
(Continued)

*Primary Examiner* — Vu A Vu

(57) ABSTRACT

An SJ-MOSFET and IGBT are provided in a single semiconductor chip. Furthermore, a balance is made between a carrier amount of n-type columns and a carrier amount of p-type columns, to encourage formation of a depletion layer in when a reverse voltage is applied in the SJ-MOSFET section. Provided is a includes a semiconductor substrate, a super junction structure formed on a front surface side of the semiconductor substrate, and a field stop layer formed at a position overlapping with the super junction structure on a back surface side of the semiconductor substrate, in a manner to not contact an end of the super junction structure on the back surface side.

10 Claims, 9 Drawing Sheets

(51) Int. Cl.

| | |
|---|---|
| H01L 21/8234 | (2006.01) |
| H01L 21/265 | (2006.01) |
| H01L 21/322 | (2006.01) |
| H01L 29/739 | (2006.01) |
| H01L 29/78 | (2006.01) |
| H01L 27/04 | (2006.01) |
| H01L 27/08 | (2006.01) |
| H01L 27/088 | (2006.01) |
| H01L 29/861 | (2006.01) |
| H01L 29/868 | (2006.01) |
| H01L 29/06 | (2006.01) |
| H01L 21/304 | (2006.01) |

(52) U.S. Cl.
CPC ........ *H01L 21/322* (2013.01); *H01L 21/8234* (2013.01); *H01L 27/04* (2013.01); *H01L 27/08* (2013.01); *H01L 27/088* (2013.01); *H01L 29/06* (2013.01); *H01L 29/0619* (2013.01); *H01L 29/0634* (2013.01); *H01L 29/739* (2013.01); *H01L 29/7395* (2013.01); *H01L 29/78* (2013.01); *H01L 29/861* (2013.01); *H01L 29/868* (2013.01)

(58) Field of Classification Search
CPC ..... H01L 29/861; H01L 27/08; H01L 27/088; H01L 21/8234; H01L 29/868; H01L 29/06; H01L 21/322; H01L 29/739; H01L 29/78; H01L 27/04
USPC ........................................................ 257/140
See application file for complete search history.

(56) References Cited

U.S. PATENT DOCUMENTS

| | | |
|---|---|---|
| 2007/0181927 A1 | 8/2007 | Yedinak et al. |
| 2011/0204469 A1 | 8/2011 | Onishi |
| 2012/0153348 A1 | 6/2012 | Aono et al. |
| 2013/0134478 A1 | 5/2013 | Nakajima et al. |
| 2013/0155745 A1* | 6/2013 | Tanaka .................. H02M 7/003 363/131 |
| 2013/0260515 A1* | 10/2013 | Mizushima ....... H01L 29/66325 438/135 |
| 2014/0070268 A1 | 3/2014 | Yoshimura et al. |
| 2014/0184303 A1 | 7/2014 | Hasegawa et al. |
| 2014/0231909 A1* | 8/2014 | Willmeroth ......... H01L 29/0634 257/339 |
| 2014/0299915 A1* | 10/2014 | Kouno .................. H01L 21/263 257/139 |
| 2015/0069462 A1 | 3/2015 | Mizushima |
| 2015/0333169 A1* | 11/2015 | Willmeroth ............. H02M 1/08 257/329 |

FOREIGN PATENT DOCUMENTS

| | | |
|---|---|---|
| JP | 2008-78282 A | 4/2008 |
| JP | 2009525610 A | 7/2009 |
| JP | 2011-134861 A | 7/2011 |
| JP | 2011171552 A | 9/2011 |
| JP | 2013-138172 A | 7/2013 |
| JP | 2013-247248 A | 12/2013 |
| WO | 2012-157772 A1 | 11/2012 |
| WO | 2013-141181 A1 | 9/2013 |

OTHER PUBLICATIONS

Office Action issued for counterpart Japanese Application 2016-555145, issued by the Japan Patent Office dated Jul. 25, 2017.

Office Action issued for counterpart Japanese Application 2016-555145, issued by the Japan Patent Office dated Dec. 5, 2017.

* cited by examiner

REGION A1-A2 OF SJ-MOSFET SECTION 10

REGION B1-B2 OF IBGT SECTION 20

REGION A1-A2 OF SJ-MOSFET SECTION 10

REGION B1-B2 OF IBGT SECTION 20

SEMICONDUCTOR DEVICE AND SEMICONDUCTOR DEVICE MANUFACTURING METHOD

The contents of the following Japanese patent applications are incorporated herein by reference:
NO. 2014-216872 filed in JP on Oct. 24, 2014, and
NO. PCT/JP2015/077376 filed on Sep. 28, 2015.

BACKGROUND

Conventionally, a semiconductor chip including a super junction MOSFET and a semiconductor chip including an insulated gate bipolar transistor have been connected in parallel, as shown in Patent Document 1, for example. The term "super junction" is abbreviated hereinafter as SJ. The term "insulated gate bipolar transistor" is abbreviated hereinafter as IGBT. Furthermore, conventionally, an SJ-MOSFET structure is known that includes a p+ collector layer, as shown in Patent Document 2, for example.

Patent Document 1: Japanese Patent Application Publication No. 2014-130909 (US Patent Application Publication No. 2014/184303)

Patent Document 2: Japanese Patent Application Publication No. 2013-102111 (US Patent Application Publication No. 2013/134478)

However, in Patent Document 1, the semiconductor chip including the SJ-MOSFET and the semiconductor chip including the IGBT are connected by wiring to form a module. Therefore, compared to a case where the SJ-MOSFET and IGBT are formed in a single semiconductor chip, the module cannot be miniaturized. In Patent Document 2, the upper border of the depletion layer weakening region including protons is provided in a manner to approximately match the bottom surface of the p-type column layer (see FIG. 1 and paragraphs 0055 and 0056). As a result, the protons that have become donors and the (n−)-type base layer contact each other, and therefore there are more electrons that are carriers in the (n−)-type base layer than holes that are carriers in the p-type column layer, which damages the carrier balance. Accordingly, the depletion layer is difficult to form because of the (n−)-type base layer and the p-type column layer.

SUMMARY

According to a first aspect of the present invention, provided is a semiconductor device comprising a semiconductor substrate, a super junction structure, and a field stop layer. The super junction structure may be formed on a front surface side of the semiconductor substrate. The field stop layer may be formed at a position overlapping with the super junction structure on a back surface side of the semiconductor substrate, in a manner to not contact an end of the back surface side of the super junction structure.

An impurity concentration distribution of the field stop layer may have a plurality of peaks and, among the peaks, the peak closest to the back surface side of the semiconductor substrate may be the largest peak. The field stop layer may include protons as an impurity.

An impurity concentration distribution of the field stop layer may gradually decrease in a direction from the back surface side of the semiconductor substrate toward the front surface side of the semiconductor substrate. The field stop layer may include selenium as an impurity.

Distance in a depth direction between the super junction structure and the field stop layer may be less than or equal to 20 μm. The semiconductor device may include a super junction transistor element and an IGBT element. The super junction transistor element may be formed in the semiconductor substrate. The super junction transistor element may include the super junction structure and a portion of the field stop layer. The IGBT element that may be formed in the semiconductor substrate. The IGBT element that may include a portion of the field stop layer.

The semiconductor substrate may include a drain layer that is closer to the back surface than the field stop layer is. The semiconductor substrate may include a floating region that is provided between the field stop layer and the drain layer. The floating region may have a polarity differing from polarities of the field stop layer and the drain layer.

According to a second aspect of the present invention, provided is a semiconductor device manufacturing method, comprising forming a super junction structure in a semiconductor substrate and forming a field stop layer. The forming the field stop layer may include forming the field stop layer at a position overlapping with the super junction structure on a back surface side of the semiconductor substrate, in a manner to not contact an end of the back surface side of the super junction structure. The semiconductor device manufacturing method may further include, after the forming of the super junction structure, grinding the back surface of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
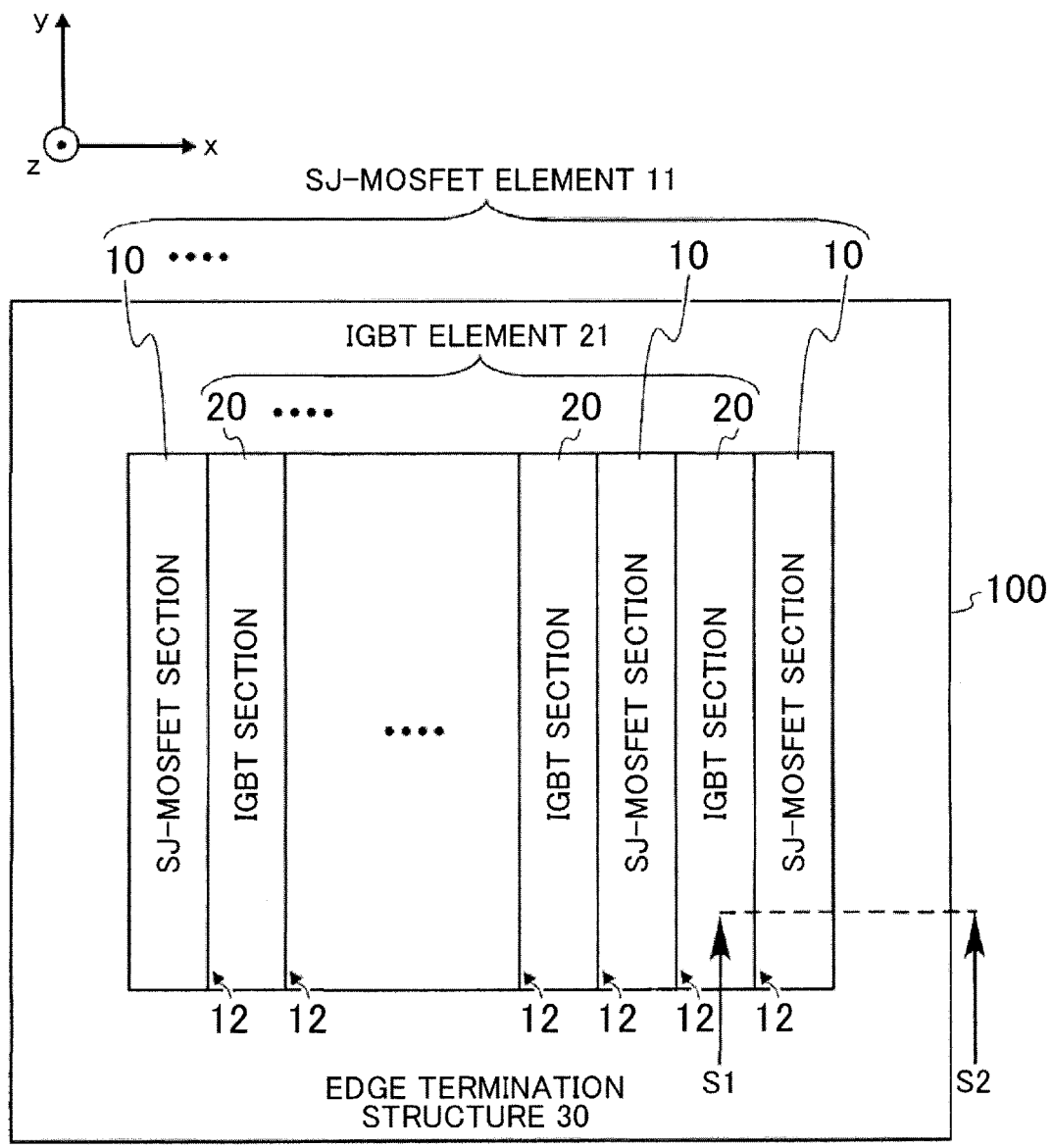
FIG. 1 is a planar view of a semiconductor device 200 as seen from a front surface side of a semiconductor substrate 100.

FIG. 1 is a planar view of a semiconductor device 200 as seen from a front surface side of a semiconductor substrate 100. The semiconductor device 200 includes the semiconductor substrate 100. An SJ-MOSFET section 10 and an IGBT section 20 are provided on the semiconductor substrate 100. An edge termination structure 30 is provided on the semiconductor substrate 100 in a manner to surround the SJ-MOSFET section 10 and the IGBT section 20 in the x-y plane.

In this Specification, the x direction and the y direction are perpendicular to each other. The z direction is perpendicular to a plane defined by the x direction and the y direction. The z direction needs not be the parallel to the direction of gravity. The lengths of the semiconductor substrate 100 in the x direction and in the y direction are each sufficiently greater than the length of the semiconductor substrate 100 in the z direction. In this Specification, for ease of explanation, the surface of the semiconductor substrate 100 on the +z side is referred to as the front surface and the surface of the semiconductor substrate 100 on the opposite side is referred to as the back surface. The x-y plane is parallel to both the front surface and the back surface of the semiconductor substrate 100.

The semiconductor device 200 of this example includes the SJ-MOSFET section 10 and the IGBT section 20 that are each longer in the y direction than in the x direction. In other words, the SJ-MOSFET section 10 and the IGBT section 20 each have a striped shape that is long in the y direction. The semiconductor device 200 includes a boundary portion 12 between the SJ-MOSFET section 10 and the IGBT section 20.

The semiconductor device 200 includes an SJ-MOSFET section 10 at one x-direction end thereof. The semiconductor device 200 has a structure in which a plurality of the SJ-MOSFET sections 10 and the IGBT sections 20 are arranged repeatedly along the x direction. The semiconductor device 200 includes an SJ-MOSFET section 10 at the opposite x-direction end thereof. In other words, the semiconductor device 200 includes SJ-MOSFET sections 10 at both ends thereof in the x direction.

In a cross section obtained by cleaving the semiconductor device 200 in the x-z plane that is perpendicular to the front surface of the semiconductor substrate 100, the semiconductor device 200 includes the IGBT sections 20 in regions sandwiched by SJ-MOSFET sections 10. The regions sandwiched by the SJ-MOSFET sections 10 are regions where an IGBT section 20 is sandwiched on both ends in the x direction by two SJ-MOSFET sections 10.

Each SJ-MOSFET section 10 includes one or more super junction transistor regions. Each IGBT section 20 includes one or more IGBT regions. It should be noted that each SJ-MOSFET section 10 includes only a super junction transistor region and does not include any IGBT regions. Furthermore, each IGBT section 20 includes only an IGBT region and does not include any super junction transistor regions.

In this Specification, the super junction transistor regions are the smallest unit regions of a region forming a super junction transistor. Furthermore, the IGBT regions are the smallest unit regions of a region forming an IGBT. The withstand voltage of each IGBT region is higher than the withstand voltage of each super junction transistor region. For example, each IGBT region has a withstand voltage of approximately 700 V, and each super junction transistor region has a withstand voltage of approximately 650 V. A detailed description of the structure of the super junction transistor regions and the IGBT regions is provided in conjunction with the next drawing.

In this Specification, a group of super junction transistor regions including two or more super junction transistor regions is referred to as an SJ-MOSFET section 10. Furthermore, a plurality of SJ-MOSFET sections 10 in one semiconductor substrate 100 are referred to collectively as an SJ-MOSFET element 11. Similarly, a group of IGBT regions including two or more IGBT regions is referred to as an IGBT section 20. Furthermore, a plurality of IGBT sections 20 in one semiconductor substrate 100 are referred to collectively as an IGBT element 21.

The semiconductor device 200 of this example includes a plurality of SJ-MOSFET sections 10 and IGBT sections 20 arranged repeatedly along the x direction, and therefore the super junction transistor regions and IGBT regions are provided respectively at different position in the semiconductor substrate 100. Specifically, one or more IGBT regions are provided in regions sandwiched by two or more super junction transistor regions. Furthermore, SJ-MOSFET sections 10 are provided at both ends of the semiconductor substrate 100 in the x direction.

When the power supply of the semiconductor device 200 is turned ON, the drain-source voltage ($V_{DS}$) of the super junction transistor regions and the collector-emitter voltage ($V_{CE}$) of the IGBT regions gradually increase, and when $V_{DS}$ and $V_{CE}$ exceed a prescribed voltage value, the current ($I_{CE}$) flowing through the IGBT regions becomes greater than the current ($I_{DS}$) flowing through the super junction transistor regions. The load placed on the super junction transistor regions and the IGBT regions is determined by the product of the current ($I_{CE}$ or $I_{DS}$) and the voltage ($V_{DS}$ or $V_{CE}$). Therefore, when a voltage higher than the prescribed voltage value is applied, the load on the super junction transistor regions becomes smaller than the load on the IGBT regions.

When the power supply of the semiconductor device 200 is turned OFF, the super junction transistor regions and IGBT regions enter a reverse bias state. During the reverse bias state, the breakdown endurance is higher for whichever region has a smaller load in the ON state. In the ON state where a voltage higher than the prescribed voltage value is applied, the load on the super junction transistor regions is less than the load on the IGBT regions. Therefore, during the reverse bias state, the breakdown endurance of the super junction transistor regions is higher than the breakdown endurance of the IGBT regions.

On the semiconductor substrate 100, the super junction transistor regions and the IGBT regions are electrically connected in parallel. The super junction transistor regions function as a diode during reverse recovery. When there are too few super junction transistor regions, the semiconductor device 200 exhibits hard recovery characteristics during reverse recovery. Therefore, in order to realize soft recovery characteristics to a certain extent, it is necessary to have a certain number of super junction transistor regions. Furthermore, when the number of super junction transistor regions is too much higher than the number of IGBT regions, the IGBT characteristics in the semiconductor device 200 are lost. Therefore, a balance is desired between the number of super junction transistor regions and the number of IGBT regions.

The semiconductor device 200 includes the IGBT sections 20 that each have two or more IGBT regions in regions sandwiched by super junction transistor regions. For example, in each SJ-MOSFET section 10 and each IGBT section 20, two super junction transistor regions and two IGBT regions are respectively provided. The ratio of the number of IGBT regions in the IGBT sections 20 to the number of super junction transistor regions in the SJ-MOSFET sections 10 differ according to the use of the product, but is preferably from 1:1 to 3:1.

In this example, the super junction transistor regions and the IGBT regions are not provided in a manner alternating one at a time, but instead are provided in alternating sets of a plurality of super junction transistor regions and a plurality of IGBT regions. In this way, compared to a case where the super junction transistor regions and IGBT regions are provided in a manner alternating one at a time, it is possible to decrease the ratio of boundary portions 12.

In the semiconductor device 200 including the super junction transistor regions and the IGBT regions on the semiconductor substrate 100, output characteristics of the super junction transistor regions are preferably realized in the low-voltage regions and output characteristics of the IGBT regions are preferably realized at high voltages. However, in a configuration where the super junction transistor regions and the IGBT regions are provided in a manner alternating one at a time, abnormal voltage-current characteristics (i.e. characteristic gaps) can occur due to the super junction transistor regions and IGBT regions interfering with each other. Therefore, a configuration in which the super junction transistor regions and the IGBT regions are provided in a manner alternating one at a time is not preferable. In this example, each SJ-MOSFET section 10 includes two or more super junction transistor regions and each IGBT section 20 includes two or more IGBT regions, and therefore, compared to a case where the super junction transistor regions and the IGBT regions are provided in a manner alternating one at a time, it is possible to restrict the abnormal voltage-current characteristics (i.e. characteristic gaps).

Figure 2:
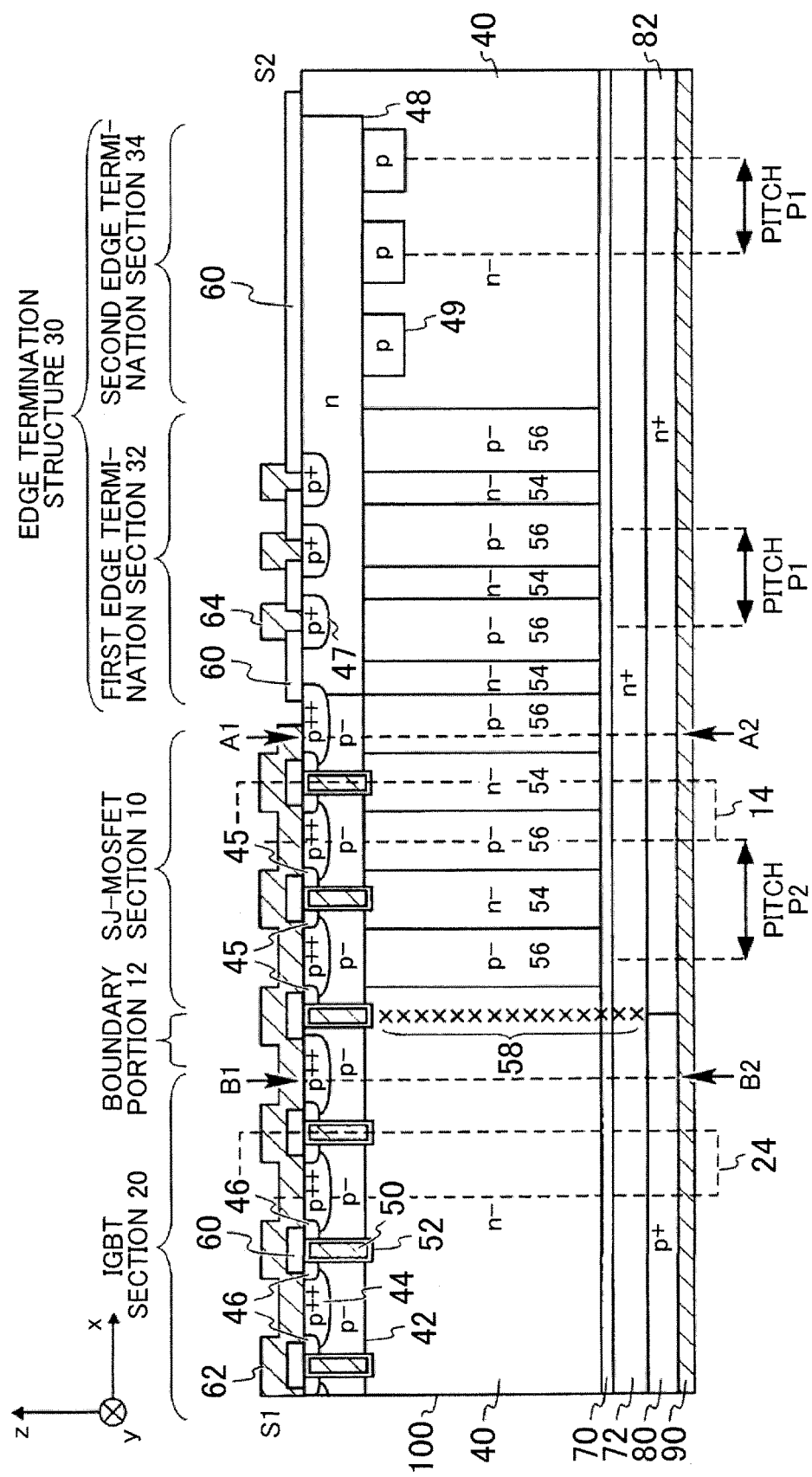
FIG. 2 shows the S1-S2 cross section of the semiconductor device 200.

FIG. 2 shows the S1-S2 cross section of the semiconductor device 200. The semiconductor device 200 in this cross-sectional view includes an SJ-MOSFET section 10, an IGBT section 20, a boundary portion 12 between the SJ-MOSFET section 10 and the IGBT section 20, and an edge termination structure 30. In this example, the first conductivity type is n-type and the second conductivity type is p-type. However, in other example, these types may be reversed such that the first conductivity type is p-type and the second conductivity type is n-type. As long as elements and formation techniques are not explicitly stated, the n-type and p-type conductivity types of the semiconductor substrate 100 can be formed using known elements and known formation techniques.

The SJ-MOSFET section 10 has a super junction structure formed in the front surface side of the semiconductor substrate 100. In this Specification, a super junction structure refers to n-type columns 54 and p-type columns 56 provided adjacent to each other in a repeating manner in the x-direction of the super junction transistor region 14.

The SJ-MOSFET section 10 includes two or more super junction transistor regions 14. In this example, the SJ-MOSFET section 10 includes five super junction transistor regions 14. It should be noted that, in order to make the drawing easily understandable, a reference numeral is given to only one of the super junction transistor regions 14. Each super junction transistor region 14 includes a p-type base layer 42, a contact region 44, a source region 45, a gate electrode 50, a gate insulating film 52, and an n-type column 54 and p-type column 56 that are adjacent in the x direction.

In this example, the p-type base layer 42 has (p−)-type impurities, the contact region 44 has (p+)-type impurities, and the source region 45 has (n+)-type impurities. Furthermore, the n-type columns 54 and p-type columns 56 that are adjacent in the x direction respectively have (n−)-type impurities and (p−)-type impurities.

Two adjacent super junction transistor regions 14 share one n-type column 54 or one p-type column 56. In this example, two adjacent super junction transistor regions 14 share one n-type column 54. Furthermore, two adjacent super junction transistor regions 14 share one gate electrode 50 and one gate insulating film 52.

The IGBT section 20 includes two or more IGBT regions 24. In the portion shown in FIG. 2, the IGBT section 20 includes six IGBT regions 24. It should be noted that, in order to make the drawing easily understandable, a reference numeral is given to only one of the IGBT regions 24. Each IGBT region 24 includes a p-type base layer 42, a contact region 44, an emitter region 46, a gate electrode 50, a gate insulating film 52, and an n-type base layer 40. The emitter region 46 has (n+)-type impurities.

Two adjacent IGBT regions 24 share an n-type base layer 40. Furthermore, two adjacent IGBT regions 24 share one gate electrode 50 and one gate insulating film 52.

During a reverse bias state, to make the withstand voltage of the super junction transistor regions 14 lower than the withstand voltage of the IGBT regions 24, the intervals between the gate electrodes 50 of adjacent IGBT regions 24 are made wider than the intervals between the gate electrodes 50 of adjacent super junction transistor regions 14 as needed. Alternatively, the withstand voltage of the IGBT regions can also be made high by lowering the impurity concentration of the n-type base layers 40 of the IGBT regions.

(Boundary Portions 12) When a forward voltage is applied to turn ON the semiconductor device 200, the n-type base layers 40 of the boundary portions 12 of this example are regions having a higher carrier amount than the n-type columns 54 of the SJ-MOSFET section 10 and having a lower carrier amount than the n-type base layers 40 of the IGBT section 20. The carriers of the IGBT regions 24 are holes and electrons, and the carriers of the super junction transistor regions 14 are only electrons. Therefore, when the semiconductor device 200 operates according to a forward voltage, the carrier amount of the IGBT regions 24 is greater than the carrier amount of the super junction transistor regions 14. For example, the carrier amount of the IGBT regions 24 is greater than the carrier amount of the super junction transistor regions 14 by a factor of 10.

During a reverse bias state, if it were assumed that there are no boundary portions 12 and the SJ-MOSFET section 10 and IGBT section 20 are continuous and in direct contact with each other, the n-type base layer 40 at the boundary portion between the SJ-MOSFET section 10 and the IGBT section 20 would be a portion where the carrier amount changes suddenly. In such a case, a strong electrical field acts at the n-type base layer 40 of the boundary portion, and therefore there is a possibility that the semiconductor device 200 would break down and be damaged.

Therefore, a region having an intermediate carrier amount between the carrier amount of the n-type column 54 and the carrier amount of the n-type base layer 40 when a forward voltage is applied is provided in the n-type base layer 40 of the boundary portion 12. In this example, a defect region 58 with a lifetime killer injected thereto is included in the n-type base layer 40 serving as a drift region in the boundary portions 12 between the IGBT regions 24 and the super junction transistor regions 14. Injection of the lifetime killer may refer to the formation of the defect region 58 having lattice defects in the n-type base layer 40 by injecting an electron beam, protons ($H^+$), or helium (He) from the front surface side and/or back surface side of the semiconductor substrate 100 during the manufacturing process.

Each boundary portion 12 includes a defect region 58, and therefore, when the semiconductor device 200 is in a reverse bias state, it is possible to soften the change in the carrier amount between the n-type columns 54 and the n-type base layers 40. Accordingly, it is possible to prevent the electrical field from being focused at the n-type base layers 40 of the boundary portions 12 during a reverse bias and prevent the semiconductor device 200 from breaking down.

(Front Surface Structure) The structure of the semiconductor substrate 100 on the front surface side is the same for both the SJ-MOSFET section 10 and the IGBT section 20. The gate electrodes 50 in this example are trench gate electrodes. The gate electrodes 50 are electrically insulated from the semiconductor substrate 100 by the gate insulating film 52. The p-type base layers 42 and the contact regions 44 are provided respectively between two gate electrodes 50.

In the super junction transistor regions 14, source regions 45 are provided between the contact regions 44 and the gate electrodes 50. In the IGBT regions 24, emitter regions 46 are provided between the contact regions 44 and the gate electrodes 50.

The insulating layer 60 is provided closer to the front surface of the semiconductor substrate 100 than the gate electrode 50. The front surface electrodes 62 are provided closer to the front surface than the insulating layer 60. The front surface electrodes 62 contact at least the contact regions 44, from among the contact regions 44, the source regions 45, and the emitter regions 46.

The structure of the boundary portion 12 on the front surface side is approximately the same as that of both the SJ-MOSFET section 10 and the IGBT section 20. However, it should be noted that no emitter regions 46 are provided between the boundary portion 12 and the IGBT section 20. In this way, the boundary portion 12 is prevented from operating as the IGBT region 24.

(Back Surface Structure) The n-type layer 70 is provided on the back surface of the n-type base layer 40 in contact with the n-type base layer 40, in the IGBT section 20. The n-type layer 70 is provided on the back surface of the super junction structure in contact with the super junction structure of the n-type columns 54 and the p-type columns 56, in the SJ-MOSFET section 10.

If it were assumed that the n-type layer 70 was not provided, the FS layer 72 would be in direct contact with the n-type columns 54 and the p-type columns 56 in the SJ-MOSFET section 10. Since the FS layer 72 is (n+)-type and the n-type columns 54 are (n−)-type, when the FS layer 72 and the n-type columns 54 directly contact each other, the carrier amount of the n-type columns 54 increases. In this way, the balance between the amount of electrons, which are the carriers of the n-type columns 54, and the amount of holes, which are the carriers of the p-type columns 56, is disturbed.

When the balance between the carrier amounts of the n-type columns 54 and the p-type columns 56 is disturbed, it is impossible to completely deplete the n-type columns 54 and the p-type columns 56 when a reverse voltage is applied. Therefore, the n-type layer 70 is provided in order to maintain the balance between the carrier amounts of the n-type columns 54 and the p-type columns 56. In this example, the n-type layer 70 may be (n−)-type, in the same manner as the n-type columns 54.

By causing the n-type columns 54 and p-type columns 56 to have approximately the same carrier amounts, the amount of positive charge and the amount of negative charge become substantially equal. Therefore, the n-type columns 54 and the p-type columns 56 can be completely depleted when the reverse voltage is applied. Accordingly, the withstand voltage of the SJ-MOSFET section 10 when a reverse voltage is applied is improved.

The FS layer 72 is a field stop layer. The FS layer 72 is provided on the back surface side of the n-type layer 70. The FS layer 72 is formed at a position overlapping the super junction structure of the SJ-MOSFET section 10 on the back surface side of the semiconductor substrate 100, and is formed in a manner to not contact the back surface side end of the super junction structure.

The FS layer 72 may be formed by using a dose of protons ($H^+$) or selenium (Se) and performing thermal processing. The FS layer 72 of this example is an n+ layer. The FS layer 72 prevents the depletion layer from reaching the collector layer 80 when a reverse bias is applied to the semiconductor device 200. A portion of the defect region 58 is formed in the FS layer 72.

The collector layer 80 is provided on the back surface side of the FS layer 72. In other words, the collector layer 80 is provided closer to the back surface than the FS layer 72. The collector layer 80 functions as a collector layer of the IGBT section 20. The collector layer 80 of this example is a (p+)-type layer.

The drain layer 82 is provided closer to the back surface than the FS layer 72. The drain layer 82 functions as a drain layer of the SJ-MOSFET section 10. The drain layer 82 of this example is an (n+)-type layer.

As made clear by FIG. 2, each super junction transistor region 14 of this example includes a portion of the n-type layer 70, a portion of the FS layer 72, a portion of the drain layer 82, and a portion of the back surface electrode 90. Furthermore, each IGBT region 24 includes a portion of the n-type layer 70, a portion of the FS layer 72, a portion of the collector layer 80, and a portion of the back surface electrode 90.

(Operation of the SJ-MOSFET Section 10) The following is a simple description of the operation of the SJ-MOSFET section 10. When a prescribed voltage is applied to the gate electrodes 50 of the SJ-MOSFET section 10, an inversion layer is formed near the boundary between the gate insulating film 52 and the p-type base layer 42. Furthermore, when a forward voltage is applied to the semiconductor device 200, a prescribed voltage that is higher than the voltage of the drain layer 82 is applied to the source regions 45. As a result, electrons flow from the front surface electrodes 62 to the back surface electrode 90 through the contact regions 44, the source regions 45, the inversion layer formed in the p-type base layer 42, the n-type columns 54, the FS layer 72, and the drain layer 82 in the stated order.

(Operation of the IGBT Section 20) The following is a simple description of the operation of the IGBT section 20. When a prescribed voltage is applied to the gate electrodes 50 of the IGBT section 20, an inversion layer is formed near the boundary between the gate insulating film 52 and the p-type base layer 42. When a forward voltage is applied to the semiconductor device 200, a prescribed voltage higher than the voltage of the collector layer 80 is applied to the emitter regions 46. As a result, electrons are supplied to the n-type base layer 40 from the emitter regions 46 and holes are supplied to the n-type base layer 40 from the collector layer 80. In this way, current flows from the back surface electrode 90 to the front surface electrodes 62.

(Edge Termination Structure 30) The semiconductor device 200 includes an edge termination structure 30 provided farther outward than the outermost super junction transistor region 14 among the plurality of super junction transistor regions 14. The edge termination structure 30 includes a first edge termination section 32 provided in an inner periphery thereof in the x-y plane and a second edge termination section 34 provided in an outer periphery thereof in the x-y plane. The first edge termination section 32 includes a guard ring 47. The guard ring 47 of this example is (p+)-type. The guard ring 47 is provided on the front surface side of the n-type region 48. The first edge termination section 32 includes a field plate 64 that connects to the guard ring 47 via a slit or hole formed in the insulating layer 60. The field plate 64 and the guard ring 47 are provided to form a ring shape that surrounds the SJ-MOSFET section 10 and the IGBT section 20 in the x-y plane.

The first edge termination section 32 has a structure in which n-type columns 54 and p-type columns 56 are formed repeatedly, in the same manner as the SJ-MOSFET section 10. The n-type columns 54 and the p-type columns 56 are formed from the back surface side end of the n-type region 48 to the front surface side end of the FS layer 72. With this structure of the repeating n-type columns 54 and p-type columns 56, it is possible to prevent the depletion layer from expanding in the x-y plane direction when a reverse bias is applied to the semiconductor device 200. Furthermore, the field plate 64 collects the front surface charge that gathers on the front surface of the semiconductor substrate 100, and can therefore prevent changes in the withstand voltage of the semiconductor device 200 caused by this front surface charge.

The second edge termination section 34 includes an n-type region 48 as a first conductivity type region. The second edge termination section 34 includes p-type regions 49 as second conductivity type columns. The n-type base layer 40 is present from the n-type region 48 of the second edge termination section 34 to the FS layer 72. The p-type regions 49 are provided with intervals therebetween in the n-type base layer 40. The depth of the ends of the p-type regions 49 is less than the depth of the ends of the p-type columns 56 of the super junction transistor regions 14.

The depth of the ends of the p-type columns 56 refers to the z coordinates of the ends of the p-type columns 56 near the FS layer 72. The depth of the ends of the p-type regions 49 refers to the z coordinates of the ends of the p-type regions 49 on the back surface side. Ends having less depth means that these ends are positioned closer to the front surface when the z coordinates thereof are compared to the z coordinates of ends positioned closer to the back surface.

The pitch width P1 of the p-type columns 56 in the first edge termination section 32 is the same as the pitch width P1 of the p-type regions 49 in the second edge termination section 34. This pitch width P1 is less than the pitch width P2 of the p-type columns 56 in the SJ-MOSFET section 10. As a result, compared to a case where the pitch width P1 of the edge termination structure 30 is the same as the pitch width P2 of the SJ-MOSFET section 10, the expansion of the depletion layer to the end of the semiconductor substrate 100 when a reverse bias is applied is further restricted, and therefore the withstand voltage of the semiconductor device 200 can be increased.

Furthermore, by making the depth of the ends of the p-type regions 49 less than the depth of the ends of the p-type columns 56, the n-type region becomes larger than the p-type region in the second edge termination section 34. Therefore, when the depletion layer has expanded from the first edge termination section 32 to the second edge termination section 34 when a reverse bias is applied to the semiconductor device 200, carriers that are primarily electrons are provided from the n-type base layer 40 to this depletion layer. As a result, the depletion layer can be prevented from reaching the end of the semiconductor substrate 100 in the x direction.

Figure 3A:
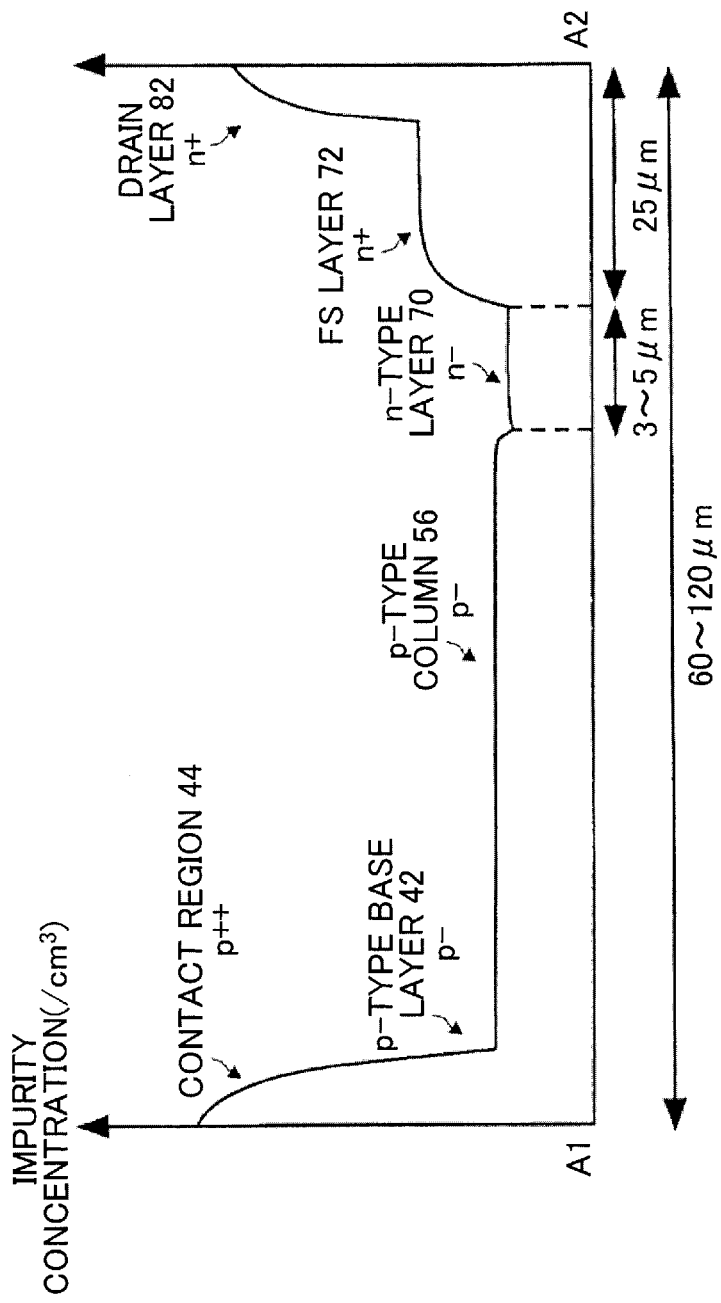
FIG. 3A shows the impurity concentration in the A1-A2 region of the SJ-MOSFET section 10.
Figure 3B:
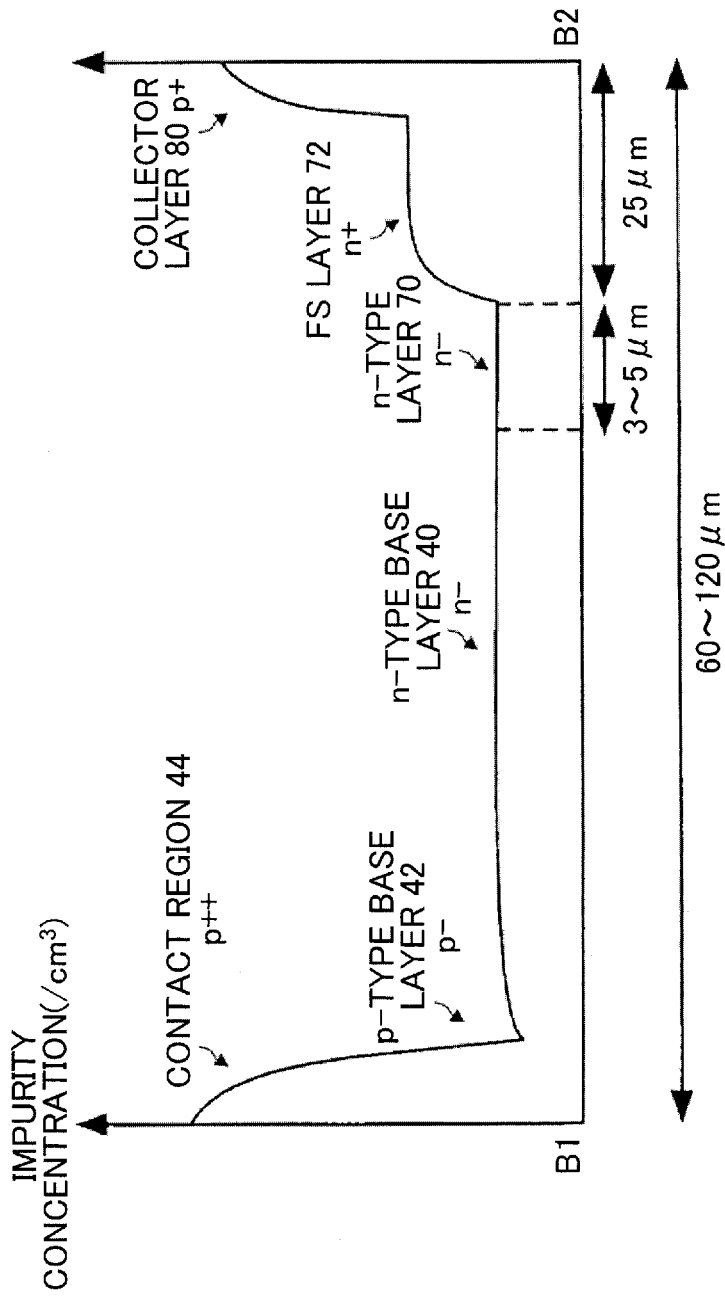
FIG. 3B shows the impurity concentration in the B1-B2 region of the IGBT section 20.

FIG. 3A shows the impurity concentration in the A1-A2 region of the SJ-MOSFET section 10, and FIG. 3B shows the impurity concentration in the B1-B2 region of the IGBT section 20. The horizontal axes indicate the length (μm) in the z direction, which is the thickness, and the vertical axes respectively indicate the n-type and p-type impurity concentrations ($cm^{-3}$).

The length from A1 to A2 and the length from B1 to B2 are equal, and together make up the thickness of the semiconductor substrate 100. The thickness of the semiconductor substrate 100 is adjusted according to the withstand voltage of the semiconductor device 200. If the withstand voltage of the semiconductor device 200 is from 600 V to 1200 V, the thickness of the semiconductor substrate 100 may be from 60 μm to 120 μm.

A contact region 44 (P++ type), the p-type base layer 42 ((p−)-type), a p-type column 56 ((p−)-type), the n-type layer 70 ((n−)-type), the FS layer 72 ((n+)-type), and the drain layer 82 ((n+)-type) are provided in the stated order from A1 to A2 in the SJ-MOSFET section 10. The n-type layer 70 between the n-type column 54 and the FS layer 72 is a region that is not affected by the impurities used when forming the FS layer 72. In other words, the impurities used when forming the FS layer 72 do not spread to this region.

The FS layer 72 is formed by doping with impurities from the back surface side. In this example, the FS layer 72 includes selenium (Se) as the impurity. The impurity concentration distribution of the FS layer 72 is formed to gradually decrease in a direction from the back surface side toward the front surface side of the semiconductor substrate 100. In this example, the selenium doped from the back surface side of the semiconductor substrate 100 is thermally diffused to the front surface side of the semiconductor substrate 100 by thermal processing after the doping. The temperature and time of the thermal processing are controlled such that the doped selenium does not reach the n-type columns 54. The thermal processing temperature may be 900° C., and the thermal processing time may be approximately 2 hours. In this way, the n-type layer 70 is formed without any of the selenium being present therein.

The thickness of the n-type layer 70 is equal to the distance in the depth direction of the FS layer 72 and the super junction structure of the n-type columns 54 and p-type columns 56. The depth direction may be a direction parallel to the z direction, a direction from the super junction structure toward the FS layer 72, or a direction from the FS layer 72 to the super junction structure. The thickness of the n-type layer 70 may be constant, regardless of the thickness of the substrate. For example, the thickness of the n-type layer 70 may be less than or equal to 20 μm. Specifically, the thickness of the n-type layer 70 may be 20, 15, 10, 9, 5, . . . 3, or 1 μm. In this example, the thickness of the n-type layer 70 is from 3 μm to 5 μm.

Phosphorous (P) cannot be used as the impurities for forming the FS layer 72 of this example. Phosphorous cannot be doped to a sufficient depth toward the front surface side when doped from the back surface side. For example, phosphorous can only be doped to a distance 1.5 μm from the back surface side. Furthermore, phosphorous cannot be driven deep enough toward the front surface side from the back surface side by thermal processing. Therefore, if phosphorous is used, the thickness of the n-type layer 70 becomes greater than 20 μm and the thickness of the FS layer 72 becomes relatively smaller. On the other hand, it is possible to restrict the expansion of the depletion layer by making the impurity concentration of the FS layer 72 higher than the impurity concentration of the n-type layer 70, and therefore the impurities of the FS layer 72 should be doped to a position that is as close as possible to the n-type layer 70 in order to draw out the function of the FS layer 72. Accordingly, instead of phosphorous, the selenium described above or protons are preferably used as the impurities of the FS layer 72.

In this example, the combined thickness of the FS layer 72 and the drain layer 82 is approximately 25 μm. However, it should be noted that the combined thickness of the FS layer 72 and the drain layer 82 may be adjusted as desired according to the thickness of the semiconductor substrate 100. The drain layer 82 is formed by further doping the FS layer 72 with n-type impurities.

A contact region 44 (p++ type), the p-type base layer 42 ((p−)-type), the n-type base layer 40 ((n−)-type), the n-type layer 70 ((n−)-type), the FS layer 72 ((n−)-type), and the collector layer 80 ((p+)-type) are provided in the stated order from B1 to B2 in the IGBT section 20. The B1-B2 region differs from the A1-A2 region by including the n-type base layer 40 instead of an n-type column 54 and by including the collector layer 80 instead of the drain layer 82. Other components in the B1-B2 region are the same as in the A1-A2 region. The n-type base layer 40 is (n−)-type, in the same manner as the n-type columns 54. In this example, the impurity concentration of the n-type base layer 40 may be the same as the impurity concentration of the n-type layer 70.

Figure 4A:
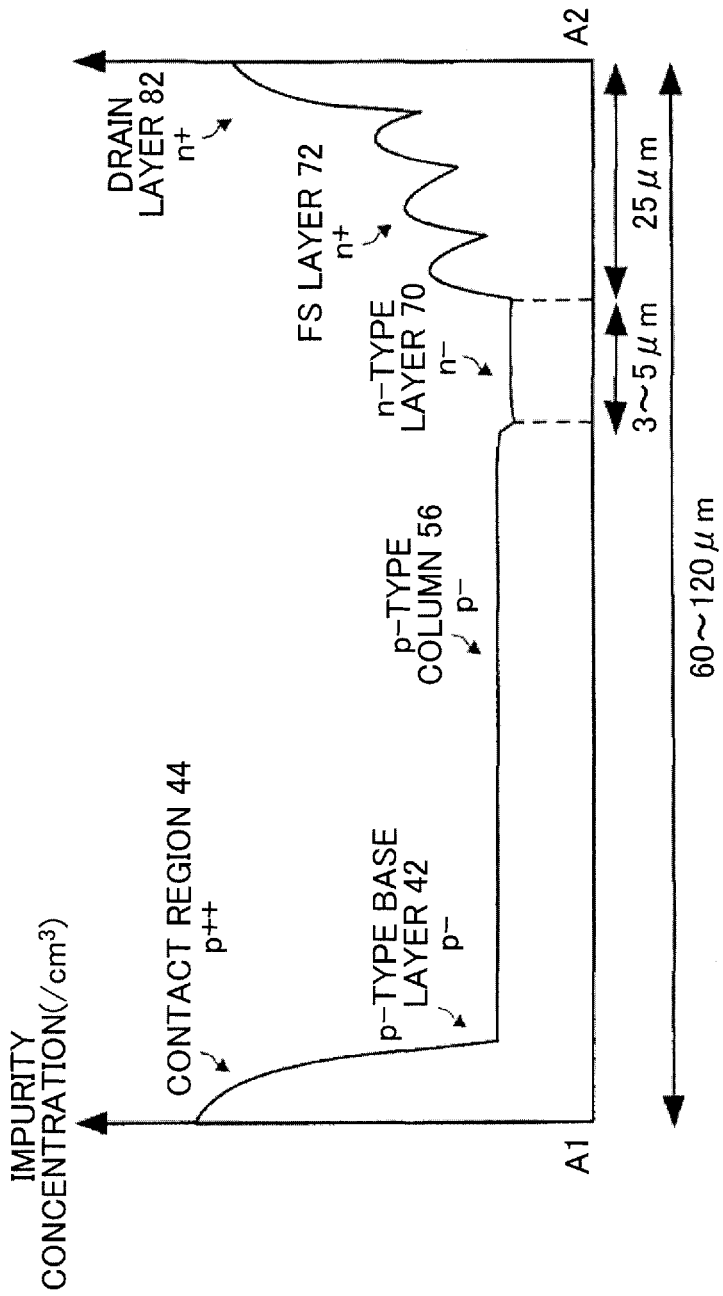
FIG. 4A shows another example of the impurity concentration in the A1-A2 region of the SJ-MOSFET section 10.
Figure 4B:
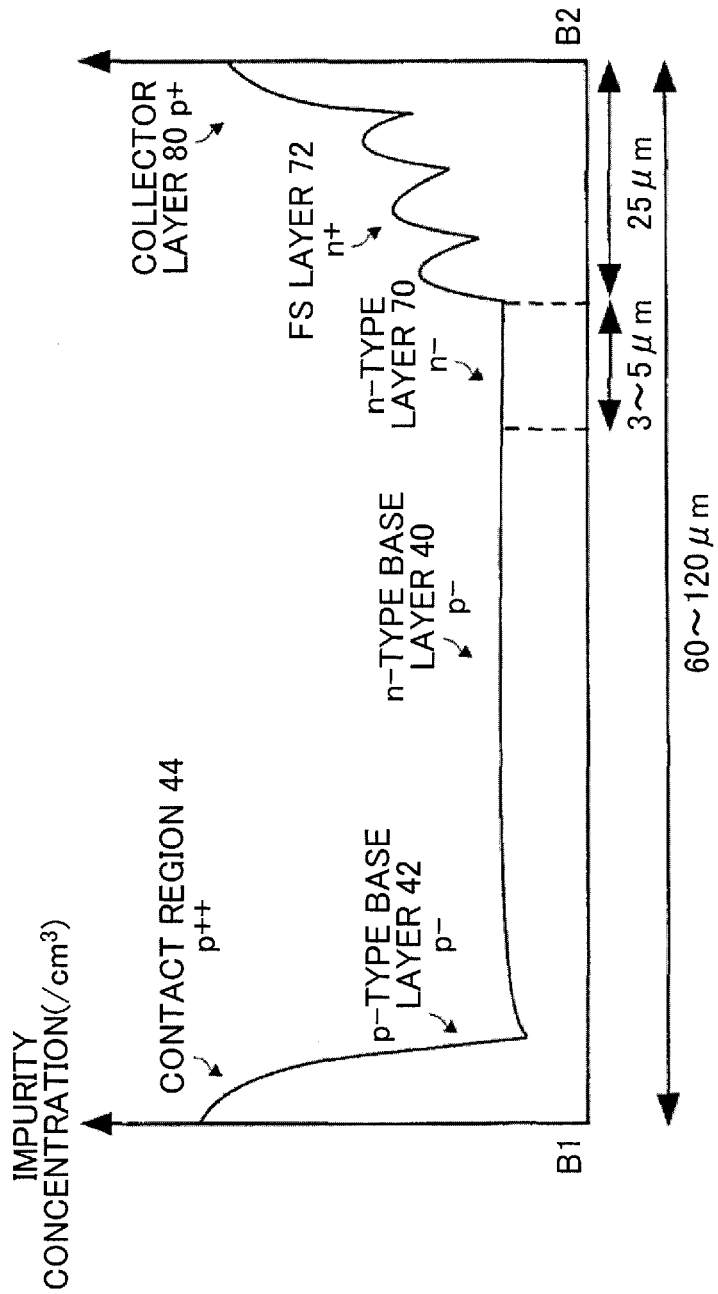
FIG. 4B shows another example of the impurity concentration in the B1-B2 region of the IGBT section 20.

FIG. 4A shows another example of the impurity concentration in the A1-A2 region of the SJ-MOSFET section 10, and FIG. 4B shows another example of the impurity concentration in the B1-B2 region of the IGBT section 20. This example differs from the example shown in FIGS. 3A and 3B in that the FS layer 72 includes protons as the impurities. Other points in this example are the same as in the example of FIGS. 3A and 3B.

The FS layer 72 is formed to include a plurality of peaks in a direction from the front surface side toward the back surface side. However, it should be noted that the FS layer 72 is formed such that the peak values become gradually smaller in a direction from the back surface side toward the front surface side. In this example, the impurity concentration distribution of the FS layer 72 has the largest peak closest to the back surface of the semiconductor substrate 100. Therefore, the FS layer 72 can supply a sufficient amount of carriers when a reverse voltage is applied, and can restrict the amount of carriers near the n-type layer 70. In this example, there are peaks in the impurity concentration at three different z-coordinate positions, but the number of peaks is not limited to 3 and may instead be 4 or more.

By adjusting the acceleration voltage and doping amount between a plurality of instances of doping, it is possible to form the FS layer 72 including a plurality of proton impurity concentration peaks. For example, when doping from the back surface side, it is possible to dope the protons farther toward the front surface side by increasing the acceleration voltage. For example, by increasing the acceleration voltage to 1.0 MeV, it is possible to dope the protons farther toward the front surface side than in a case where the acceleration voltage is 0.5 MeV. In order to realize the plurality of peaks in this example, the acceleration may be selected as desired within a range from 1.45 MeV to 0.4 MeV, and the impurity doping amount may be suitably selected as desired within a range from $1E+12$ $cm^{-2}$ to $3E+14$ $cm^{-2}$.

Figure 5:
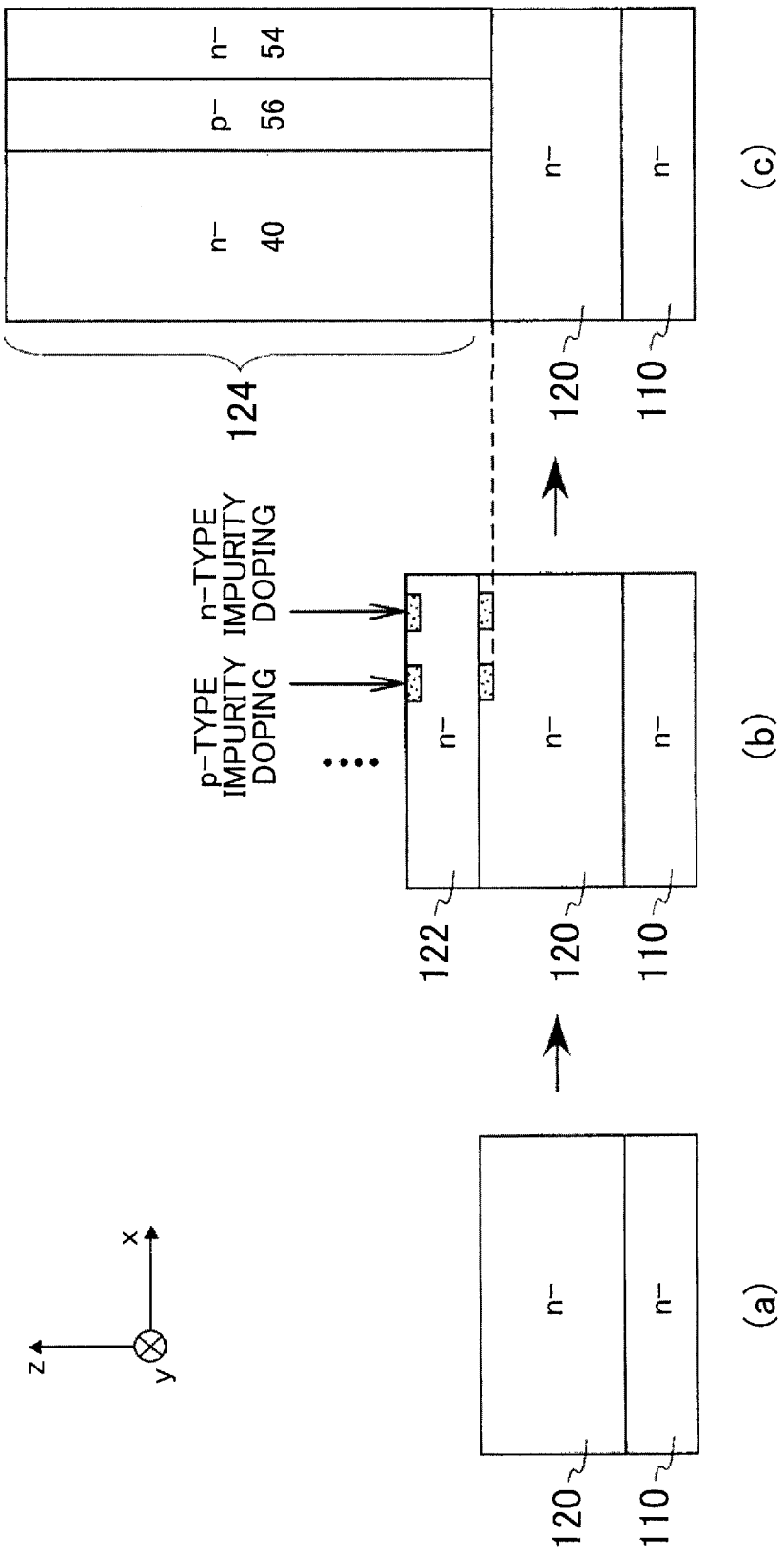
FIG. 5 shows (a) a step of forming an epitaxial layer 120, (b) a step of multilayering an epitaxial layer 122 doped with impurities, and (c) a step of forming an epitaxial layer 124.
Figure 6:
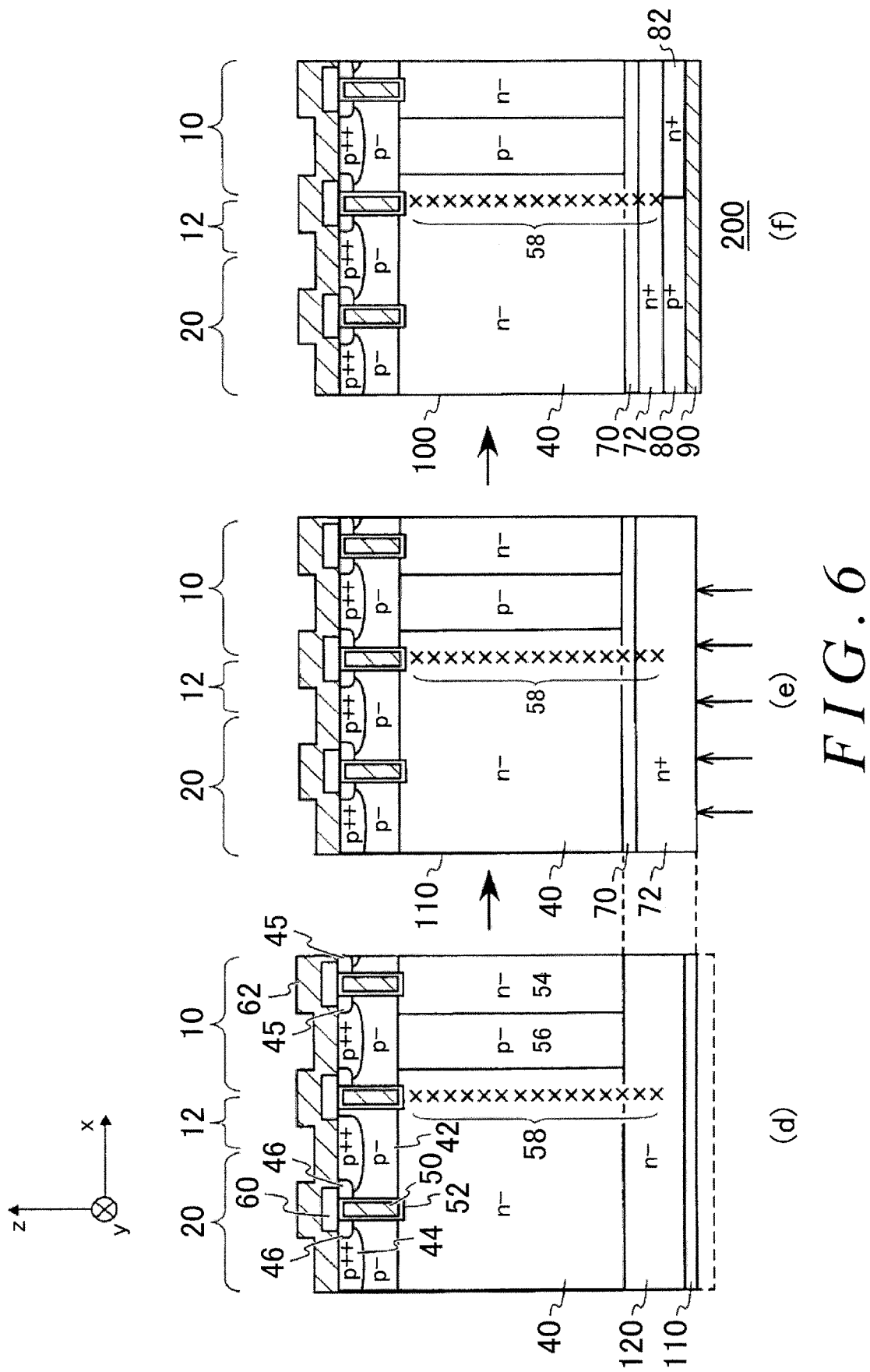
FIG. 6 shows (d) a step of forming the front surface structure and a step of grinding the back surface structure, (e) a step of forming the FS layer 72, and (f) a step of forming the back surface structure.

FIGS. 5 and 6 are cross-sectional views used to describe a manufacturing method of an SJ-MOSFET section 10, a boundary portion 12, and an IGBT section 20 of the semiconductor device 200. In FIG. 5, portion (a) shows a step of forming an epitaxial layer 120, portion (b) shows a step of multilayering an epitaxial layer 122 doped with impurities, and portion (c) shows a step of forming an epitaxial layer 124.

(FIG. 5, Portion (a): Step of Forming the Epitaxial Layer 120) First, the epitaxial layer 120 is formed in contact with the front surface of the semiconductor substrate 110. In this example, the semiconductor substrate 110 and the epitaxial layer 120 are both (n−)-type.

(FIG. 5, Portion (b): Step of Multilayering the Epitaxial Layer 122 Doped with Impurities) Next, p-type impurities and n-type impurities are locally doped at respectively different locations from the front surface side of the epitaxial layer 120. The p-type impurities may be boron (B) and the n-type impurities may be phosphorous (P).

After this, the epitaxial layer 122 is formed on the front surface side of the epitaxial layer 120. In this example, the epitaxial layer 122 is (n−)-type, in the same manner as the epitaxial layer 120. After forming the epitaxial layer 122, the p-type impurities and n-type impurities are locally doped at respectively different locations from the front surface side of the epitaxial layer 122. At this time, in the epitaxial layer 120 and the epitaxial layer 122, the x and y coordinates of the positions where the n-type impurities and the p-type impurities are respectively doped are made to substantially match. Here, making the x and y coordinates of the doping positions substantially match may mean that the error in the alignment accuracy of the masks used for the impurity doping is within a certain range.

(FIG. 5, Portion (c): Step of Forming the Epitaxial Layer 124) After this, the formation of the epitaxial layer 122 and the localized doping with the p-type impurities and n-type impurities are repeated a plurality of times. Next, thermal processing is performed to form the epitaxial layer 124 including the n-type base layer 40, the n-type column 54, and the p-type column 56. In this way, the super junction structure including the n-type column 54 and the p-type column 56 is formed on the semiconductor substrate 110.

In FIG. 6, portion (d) shows a step of forming the front surface structure and a step of grinding the back surface, portion (e) shows a step of forming the FS layer 72, and portion (f) shows a step of forming the back surface structure. The step of portion (d) in FIG. 6 is next after the step of portion (c) in FIG. 5.

(FIG. 6, Portion (d): Step of Forming the Front Surface Structure and Step of Grinding the Back Surface) First, the defect region 58 is formed by introducing the lifetime killer from the front surface side (+z side) and/or the back surface side (−z side). After this, the front surface structure including the gate electrode 50, the gate insulating film 52, the p-type base layer 42, the contact region 44, the source region 45, the emitter region 46, the insulating layer 60, and the front surface electrode 62 is formed. Next, the back surface side (−z side) of the semiconductor substrate 110 is ground. It is not necessary to grind and remove the entire original thickness of the semiconductor substrate 110. In other words, after the grinding, the semiconductor substrate 110 may retain some amount of thickness. Thickness variations in the semiconductor substrate 100 caused by grinding of the back surface are from 3 μm to 5 μm.

When forming an SJ-MOSFET device that includes an SJ-MOSFET section 10, the back surface grinding described above is not performed. This is because, unlike an IGBT device, an SJ-MOSFET device is not a device in which the withstand voltage is adjusted according to the thickness of the semiconductor substrate. Including the grinding step when forming the semiconductor device 200 that includes the SJ-MOSFET section 10 is one technical feature in this Specification.

(FIG. 6, Portion (e): Step of Forming the FS Layer 72) Next, on the back surface side of the semiconductor substrate 110 the FS layer 72 is formed at a position overlapping with the n-type base layer 40 and the super junction structure of the n-type column 54 and the p-type column 56, in a manner to not contact the end of the super junction structure on the back surface side. As described above, the FS layer 72 may be formed by doping with selenium or doping a plurality of times with protons.

(FIG. 6, Portion (0: Step of Forming the Back Surface Structure) Next, the collector layer 80 is formed by counter-doping the FS layer 72 with p-type impurities from the back surface side of the IGBT section 20. The collector layer 80 may be provided on the back surface side of the boundary portion 12. Furthermore, the drain layer 82 is formed by further doping the FS layer 72 with n-type impurities from the back surface side of the SJ-MOSFET section 10. Finally, the back surface electrode 90 is formed on the back surface side of the collector layer 80 and the drain layer 82. The back surface electrode 90 may be an aluminum layer formed by sputtering.

Figure 7:
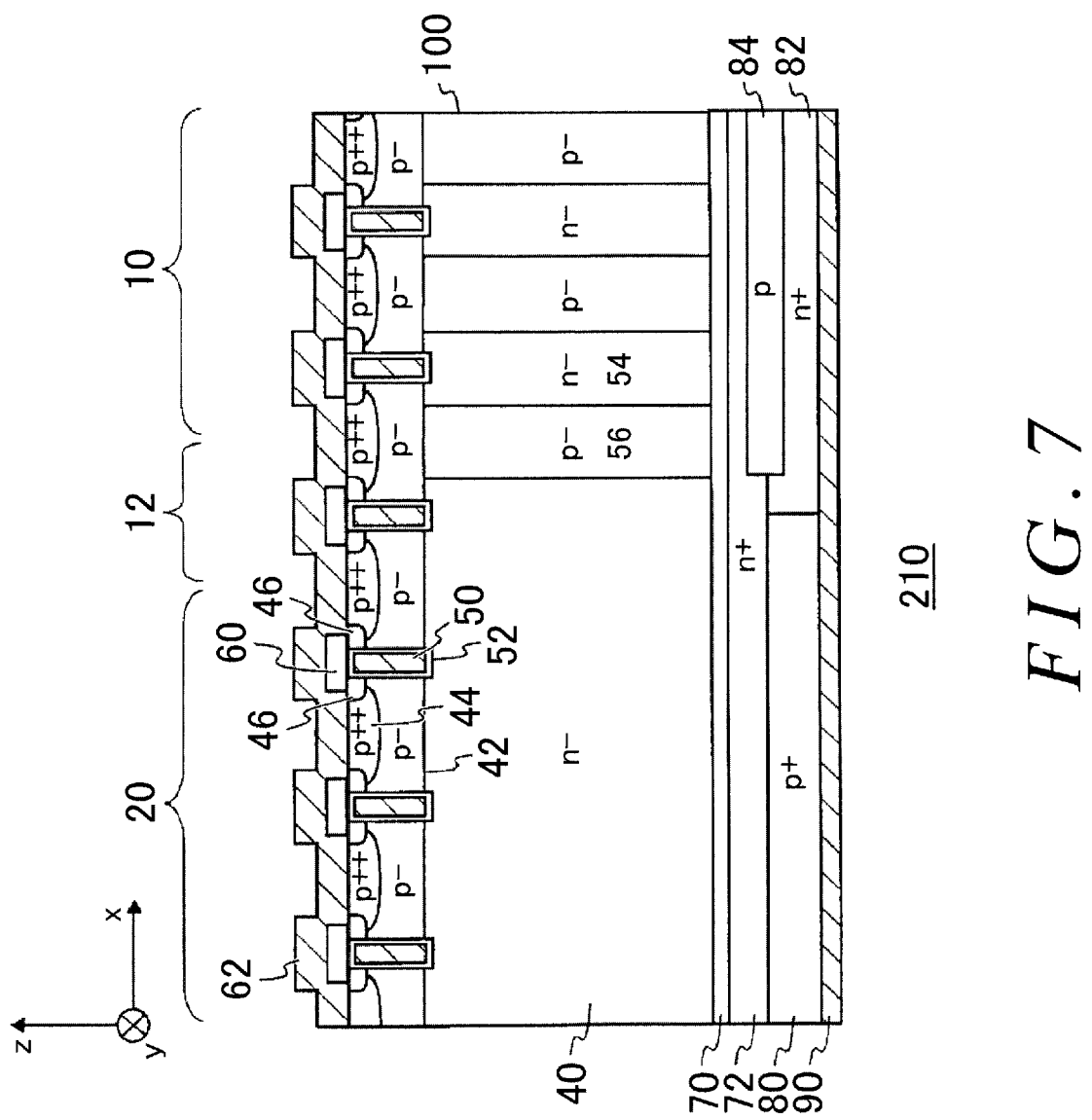
FIG. 7 is a cross-sectional view of a semiconductor device 210 that includes a modification of the SJ-MOSFET section 10.

FIG. 7 is a cross-sectional view of a semiconductor device 210 that includes a modification of the SJ-MOSFET section 10. In this example, the semiconductor substrate 100 includes a floating region 84 between the FS layer 72 and the drain layer 82. This floating region 84 includes p-type impurities, which have a different polarity than the FS layer 72 ((n+)-type) and the drain layer 82 ((n+)-type). Other points in this example are the same as those in the example of FIG. 1.

The ON voltage increases when the p-type floating region 84 contacts the back surface electrode 90. Therefore, the p-type floating region 84 is not allowed to contact the back surface electrode 90. As long as the p-type floating region 84 does not contact the back surface electrode 90, the p-type floating region 84 may be provided only in the drain layer 82. By providing the p-type floating region 84 between the FS layer 72 and the drain layer 82, when a high voltage is added during reverse recovery, the diode formed by the p-type floating region 84 and the drain layer 82 has an avalanche breakdown and holes are injected thereto. Therefore, it is possible to further improve the soft recovery characteristics of the IGBT section 20 when a reverse voltage is applied.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: SJ-MOSFET section, 11: SJ-MOSFET element, 12: boundary portion, 14: super junction transistor region, 20: IGBT section, 21: IGBT element, 24: IGBT region, 30: edge termination structure, 32: first edge termination section, 34: second edge termination section, 40: n-type base layer, 42: p-type base layer, 44: contact region, 45: source region, 46: emitter region, 47: guard ring, 48: n-type region, 49: p-type region, 50: gate electrode, 52: gate insulating film, 54: n-type column, 56: p-type column, 58: defect region, 60: insulating layer, 62: front surface electrode, 64: field plate, 70: n-type layer, 72: FS layer, 80: collector layer, 82: drain layer, 84: floating region, 90: back surface electrode, 100: semiconductor substrate, 110: semiconductor substrate, 120: epitaxial layer, 122: epitaxial layer, 124: epitaxial layer, 200: semiconductor device, 210: semiconductor device

What is claimed is:

1. A semiconductor device comprising:
   a semiconductor substrate;
   a super junction structure formed on a front surface side of the semiconductor substrate;
   a field stop layer formed at a position overlapping with the super junction structure on a back surface side of the semiconductor substrate, in a manner to not contact an end of the back surface side of the super junction structure;
   a super junction MOSFET that is formed in the semiconductor substrate and includes the super junction structure and a portion of the field stop layer; and
   an IGBT element that is formed in the semiconductor substrate and includes a portion of the field stop layer, wherein
   the super junction MOSFET includes a super junction transistor region,
   the IGBT element includes an IGBT region, and
   the semiconductor substrate includes a region, at a boundary portion between the super junction transistor region and the IGBT region, that has an intermediate carrier amount between a carrier amount of an n-type base layer of the IGBT region and a carrier amount of an n-type column of the super junction transistor region when a forward voltage is applied to the semiconductor device.

2. The semiconductor device according to claim 1, wherein
   an impurity concentration distribution of the field stop layer has a plurality of peaks and, among the peaks, the peak closest to the back surface side of the semiconductor substrate is the largest peak.

3. The semiconductor device according to claim 1, wherein
   the field stop layer includes protons as an impurity.

4. The semiconductor device according to claim 1, wherein
   in an impurity concentration distribution of the field stop layer, the impurity concentration gradually decreases in a direction from the back surface side of the semiconductor substrate toward the front surface side of the semiconductor substrate.

5. The semiconductor device according to claim 1, wherein
the field stop layer includes selenium as an impurity.

6. The semiconductor device according to claim 1, wherein
distance in a depth direction between the super junction structure and the field stop layer is less than or equal to 20 μm.

7. The semiconductor device according to claim 1, wherein
the semiconductor substrate includes a drain layer that is closer to a back surface than the field stop layer is, and
the semiconductor substrate includes a floating region that is provided between the field stop layer and the drain layer and has a polarity differing from polarities of the field stop layer and the drain layer.

8. The semiconductor device according to claim 1, wherein
the semiconductor substrate includes a defect region into which a lifetime killer is injected, at the boundary portion between the super junction transistor region and the IGBT region.

9. A semiconductor device manufacturing method comprising:
forming a super junction structure in a semiconductor substrate;
forming a field stop layer at a position overlapping with the super junction structure on a back surface side of the semiconductor substrate, in a manner to not contact an end of the back surface side of the super junction structure; and
forming, in the semiconductor substrate, a super junction MOSFET that includes the super junction structure and a portion of the field stop layer and an IGBT element that includes a portion of the field stop layer, wherein the super junction MOSFET includes a super junction transistor region and the IGBT element includes an IGBT region, and
forming, in the semiconductor substrate, a region, at a boundary portion between the super junction transistor region and the IGBT region, that has an intermediate carrier amount between a carrier amount of an n-type base layer of the IGBT region and a carrier amount of an n-type column of the super junction transistor region when a forward voltage is applied to the semiconductor device.

10. The semiconductor device manufacturing method according to claim 9, further comprising:
after the forming of the super junction structure, grinding the back surface of the semiconductor substrate.

* * * * *